United States Patent
Frommer et al.

(10) Patent No.: US 7,471,614 B2
(45) Date of Patent: Dec. 30, 2008

(54) HIGH DENSITY DATA STORAGE MEDIUM

(75) Inventors: Jane Frommer, San Jose, CA (US);
Robert D. Miller, San Jose, CA (US);
Craig Hawker, Santa Barbara, CA (US);
Urs T. Duerig, Rueschlikon (CH);
Bernd W Gotsmann, Horgen (CH);
Peter Vettiger, Langnau Am Albis (CH);
Gerd K. Binnig, Wollerau (CH); Victor Yee-Way Lee, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1346 days.

(21) Appl. No.: 10/652,543

(22) Filed: Aug. 29, 2003

(65) Prior Publication Data

US 2005/0050258 A1    Mar. 3, 2005

(51) Int. Cl.
*G11B 9/00* (2006.01)
(52) U.S. Cl. ...................................... 369/126
(58) Field of Classification Search .............. 430/270.1; 369/101, 126
See application file for complete search history.

(56) References Cited

U.S. PATENT DOCUMENTS

| | | | | |
|---|---|---|---|---|
| 5,426,086 A | * | 6/1995 | Hotta et al. | 503/208 |
| 6,136,751 A | * | 10/2000 | Harada | 503/201 |
| 6,410,479 B1 | * | 6/2002 | Fukuchi et al. | 503/226 |
| 6,803,447 B2 | | 10/2004 | Janssen et al. | |
| 6,899,992 B2 | | 5/2005 | Huang et al. | |
| 6,927,097 B2 | * | 8/2005 | Dunlap | 438/118 |
| 2002/0003726 A1 | * | 1/2002 | Hattori et al. | 365/200 |
| 2005/0088921 A1 | * | 4/2005 | Terao et al. | 369/13.01 |

FOREIGN PATENT DOCUMENTS

EP    0 425 814 A1    8/1991

OTHER PUBLICATIONS

R. Silbey et al., "Macromolecules," Physical Chemistry (Third Edition), 2001, pp. 779-862, USA.
Vettiger et al., The "Millipede"—More Than One Thousand Tips for Future AFM Data Storage, IBM J. Res. Develop, vol. 44, No. 3, May 2000, pp. 323-340.
Xiangxu Chen, New Thermally Remendable Highly Cross-Linked Polymeric Materials; Macromolecules, 2003, vol. 36, pp. 1802-1807, Feb. 15, 2003.

(Continued)

*Primary Examiner*—Joseph Feild
*Assistant Examiner*—Parul Gupta
(74) *Attorney, Agent, or Firm*—Cantor Colburn LLP; Pete Tennet

(57) ABSTRACT

A method reading, writing, and erasing data includes bringing a thermal-mechanical probe into proximity with a layer of cross-linked polymeric material to induce a deformed region at a point in the film, thereby writing information; bringing a thermal-mechanical probe into proximity with the deformed region, thereby reading information; and bringing a thermal-mechanical probe into proximity with the deformed region, further deforming it in such a way to eliminate the deformed region, thereby erasing the information; and repeating the storing, reading, and erasing steps at points in the film.

18 Claims, 7 Drawing Sheets

OTHER PUBLICATIONS

Vettiger et al, The "Millipede"—Nanotechnology Entering Data Storage, IEEE Transactions On Nanotechnology, vol. 1, No. 1, pp. 39-55, Mar. 2002.

Vettiger et al., The Nanodrive Project, Scientific American, Jan. 2003, pp. 47-53.

Robert J. Silbey and Robert Alberty, Physical Chemistry (Third Edition), Chapter 21, pp. 779-860, 2001.

H.R. Anderson, Materials for Thermoplastic Recording By Heat Alone, IBM Technical Disclosure Bulletin, vol. 6, No. 12, May 1964, p. 3.

* cited by examiner

Crosslinking polystyrene/benzocyclobutene films: (21 kDa / 4.7% BCB) on Si; crosslinked @ 250°C / 1 hr

HIGH DENSITY DATA STORAGE MEDIUM

FIELD OF THE INVENTION

The present invention relates to data storage systems having a local probe storage array, and to a polymeric data storage medium for a data processing system having a local probe array.

BACKGROUND OF THE INVENTION

A data processing system typically comprises a memory for storing computer program code instructions and a central processing unit (CPU) for executing the computer program instructions. In operation, the memory also stores input data to be operated upon by the computer program code and output data produced by execution of the computer program code. In general, the computer program code can be divided into operating system code and application program code. The operating system code configures the CPU for executing the application program code. Conventionally, the memory is implemented by a combination of solid state memory such as random access memory and rotating disc mass data storage such as magnetic or optical disc storage.

A recent addition to the field of data storage technology is generally referred to as local probe storage technology. As described in Vettiger et al. "*The Millipede"—More than one thousand tips for future AFM data storage*, P. Vettiger et al, *IBM Journal of Research and Development*. Vol. 44 No. 3, May 2000, a local probe storage array typically comprises a storage surface having a locally deformable film disposed thereon and an array of micro mechanical probe sensors. Each probe sensor has a probe tip of nanometer scale dimensions facing the deformable film. In operation, during a data write operation, the array tips are brought into proximity to the storage surface. Energy is selectively applied to each tip, typically in the form of heating and force. The energy applied to the tips is transferred to the storage surface. The energy transfer produces a local deformation in the storage surface in the vicinity of each energized tip. The array of tips is moved to a new location on the storage surface between successive write operations. This is in preparation for writing to new locations on the storage surface. During a read operation, the array tips are scanned relative to the storage surface. Local deformations of the storage surface produced during the aforementioned write operation produce deflections in the tips as they are scanned over the surface. Such deflections can be detected thermally or optically. The presence or absence of a local deformation in the storage surface can be detected by an atomic force microscopy ("AFM") tip as described above as a stored "1" or stored "0".

An improved local probe storage technology described in the commonly assigned, copending patent application, Data Processing System, EP Application No. 02405643.4, filed 23 Jul. 2002 of Gerd K. Binnig et al., provides a data processing system having a local probe storage array with a plurality of sensors for reading data from a storage surface; a plurality of data processing elements mounted on the storage array and each connected to a different sensor of the array for processing data read by said connected sensor. The data processing elements may be logic gates for performing simple comparisons with input data. Alternatively, each data processing element may comprise complex logic circuitry for performing more complex functions based on data read by the storage array.

The storage surface preferably has a plurality of data fields with each data field corresponding to a different sensor and each data field having a matrix of bit storage locations individually addressable by the corresponding sensor for writing, reading, and erasing data.

This results in a local probe array-based storage device and data processing method. The method further comprises writing data to a storage surface, reading data from a storage surface, and erasing data from a storage surface by locally deforming a storage surface and by reading the deformations, all via sensors of a local probe storage array; and processing the data read from the surface via a plurality of data processing elements mounted on the storage array and each connected to a corresponding sensor of the array.

This further results in a memory for storing data where the memory comprises a local probe storage array having a plurality of sensors for reading data from a storage surface. The storage surface comprises a plurality of data fields each corresponding to different sensors and each having a matrix of bit storage locations individually addressable by the corresponding sensor. Each field of the storage surface has different bit locations assigned to different memory pages.

The read-write mechanism in the device (referred to herein as an atomic force microscopy device) relies on thermomechanical deformation of a thin polymer film. As should be obvious, control of the heat and load transfer characteristics are highly critical aspects of the polymer and polymer film characteristics. Some control over heat and load transfer can be engineered into the design of the device's cantilever arrays. However, thermal and mechanical control must also be conferred by thoughtful design and fabrication of the polymer structure. Careful choice of the synthetic components can lead to a polymeric material with the modulus of elasticity and the thermal conductivity optimized for device energy efficiency, storage density, and long-term stability. The design of these polymeric recording layers relates to the ultra high density data storage systems of the type in which a tip comes into proximity with the polymer layer in order to execute bit-writing and bit-reading. In these data storage designs, information is detected by scanning the surface of the medium with a tip positioned in full or partial contact with, or in proximity to the polymeric recording layer and data bit values are determined by the topographical state or thermal transfer at the bit location.

The specific sensor technology is based on the atomic force microscope, a well-known device in which the topography of a sample is sensed by a tip mounted on the end of a microfabricated cantilever. As the sample is scanned, the interaction between the tip and the sample surface causes pivotal deflection of the cantilever. The sample topography is determined by detecting this deflection. More recently, this AFM technology has been applied to the field of data storage with a view to providing a new generation of high-density, high data-rate storage devices for mass-memory applications.

The cantilever-mounted tip, referred to as the read/write tip, is used for reading and writing of data on the surface of a data storage medium. In operation, the read/write tip is placed in proximity to the surface of the data storage medium. Heretofore, the storage medium typically comprised a linear polymeric material. In the write mode, the read/write tip is heated which results in heat transfer to the polymer surface layer causing local softening of the linear polymer. This allows the tip to penetrate the surface layer to form a pit, or bit indentation; such a pit may represent a bit of value "1", a bit of value "0" being represented by the absence of a pit. Alternatively, a pit may represent a bit value of "0", with a bit value of "1" being represented by the absence of a pit. This technique is referred to as thermomechanical writing.

The storage medium can be moved relative to the read/write component tip allowing the tip to write data over an area of the surface, or "storage field", corresponding to the field of movement (surface area laterally accessible to the tip). Each indentation is created by heating the cantilever tip and with the application of force moving this tip toward the polymer film. The tip is heated by passing a current through a resistive heater associated with the cantilever. Some of the heat generated in the resistor is conducted through the tip and into the polymer film, locally heating the polymer. If sufficient heat is transferred to raise the temperature of the polymer above a certain temperature (which is dependent on the chosen polymer), the linear polymer softens or goes through its glass transition temperature and the tip sinks in, creating an indentation or bit.

In the read mode, the storage field is scanned by the tip, the position of the tip and the cantilever on which it is mounted topographically tracking the presence or absence of a pit. The reading operation uses thermal sensing based on the principle that the thermal conductance between the cantilever, and components attached thereto, and the storage substrate, changes according to the distance between them; the distance is reduced as the tip moves into a bit indentation.

Heretofore the storage medium consisted of a bulk linear polymer layer, optionally implemented as a silicon substrate having a very thin layer of linear polymethylmethacrylate (PMMA) as the read/write layer. The advantage of having a silicon substrate is that the hard silicon substrate limits the penetration of the tip (this feature can also be a disadvantage) and also, because silicon is a better conductor of heat than polymers such as PMMA, there is improved transport of heat away from the pits during the reading and writing processes. The linear PMMA layer is preferably about 40 nm thick thus giving a depth of pit of up to 40 nm.

Some problems of tip wear are believed to be caused by the tip penetrating the polymer layer and making contact with the hard silicon substrate, and in a still further improved storage medium, a layer of crosslinked material, for example, SU-8 resin from MicroChem Corporation, Newton, Mass., USA, was introduced between the PMMA and the silicon substrate. SU-8 is an octafunctional epoxy resin crosslinked by a cationic photoinitiator. The layer of crosslinked material, typically about 70 nm thickness, acts as a softer penetration stop thereby reducing tip wear. When the cross-linked material is present between the linear polymer layer and the silicon substrate, no penetration into the crosslinked SU-8 layers is observed and the cross linked layer does not act as the recording layer in this example.

The efficiency of writing and reading the indentations (bits of information) is critically dependent on the nature of the polymeric thin film. Desirable attributes of the polymeric thin film are 'softness' and deformability during the writing phase, toughness/resistance to wear during the reading phase, and long-term stability over the lifetime of the stored data. A hard polymer with a high melting point will be difficult to soften sufficiently for the tip to sink in and form the pit during the writing process. By way of contrast, a hard polymer will be preferred during the reading process since the tip is required to travel across the polymer surface and the surface must be sufficiently hard and smooth to minimize the wear on the tip and damage to the surface. Finding a material with these properties is desirable and challenging since one feature normally precludes the other. Linear polymers such as PMMA have been found to have suitable writing temperatures and the force required on the tip to form the pit is acceptably low for the required tip performance and power consumption; however, the wear rate on reading has been found to be unacceptably high because of the softness of the surface. Specifically, a recording layer of linear PMMA erodes at the rate of about 0.01 nm per scan. This is an unacceptably high wear rate.

There is a clear need to overcome these problems by using a class of polymers that combine low writing temperatures, ready pit-forming by the probe for writing, and a low wear rate.

SUMMARY OF THE INVENTION

In an exemplary embodiment, a method reading, writing, and erasing data includes bringing a thermal-mechanical probe into proximity with a layer of cross-linked polymeric material to induce a deformed region at a point in the film, thereby writing information; bringing a thermal-mechanical probe into proxmty with the deformed region, thereby reading information; and bringing a thermal-mechanical probe into proximity with the deformed region, further deforming it in such a way to eliminate the deformed region, thereby erasing the information; and repeating the storing, reading, and erasing steps at points in the film.

In another embodiment, a data storage device for an atomic force microscopy data storage system is adapted for reading, writing, and erasing data by bringing a nm-scale thermal-mechanical probe into proximity with a layer of cross-linked polymeric material to induce a deformed region at a point in the film, thereby storing information; bringing a thermal-mechanical probe into contact with the point to eliminate the deformed region, thereby erasing the information; and repeating the storing and erasing steps at the point in the film.

THE FIGURES

Various aspects of the invention are illustrated in the Figures appended hereto.

Figure 4:
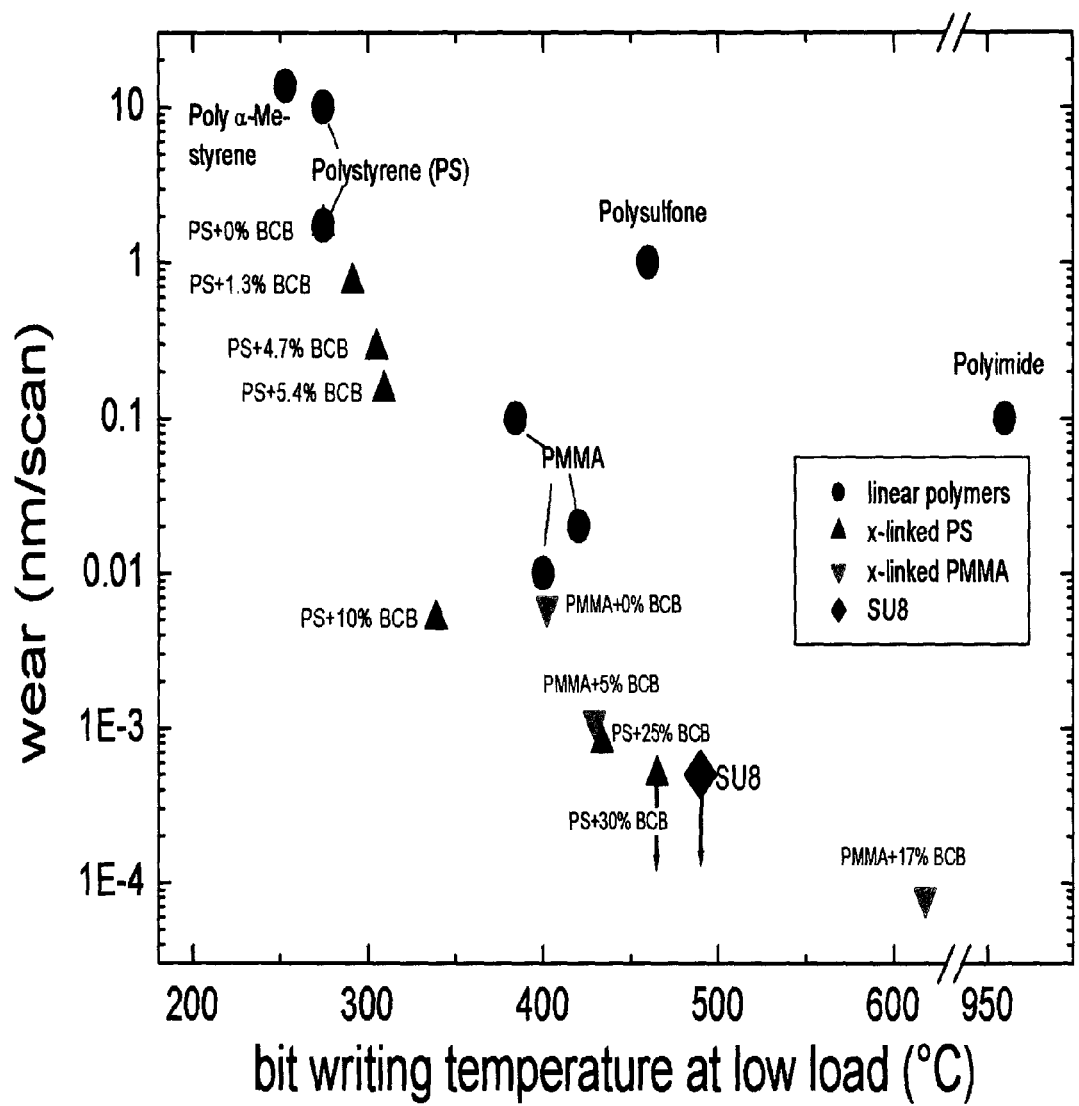

FIG. 4 is a plot of a measure of long-term stability (wear rate) as a function of indentation temperature threshold. The latter tracks with $T_g$, and correlates with the effect of cross linking on $T_g$ as demonstrated in the previous figure. Also demonstrated in this plot is the tracking of the degree of cross linking with enhanced stability, with reliable write-erase cycles being performed on highly cross linked polymers.

Figure 5:
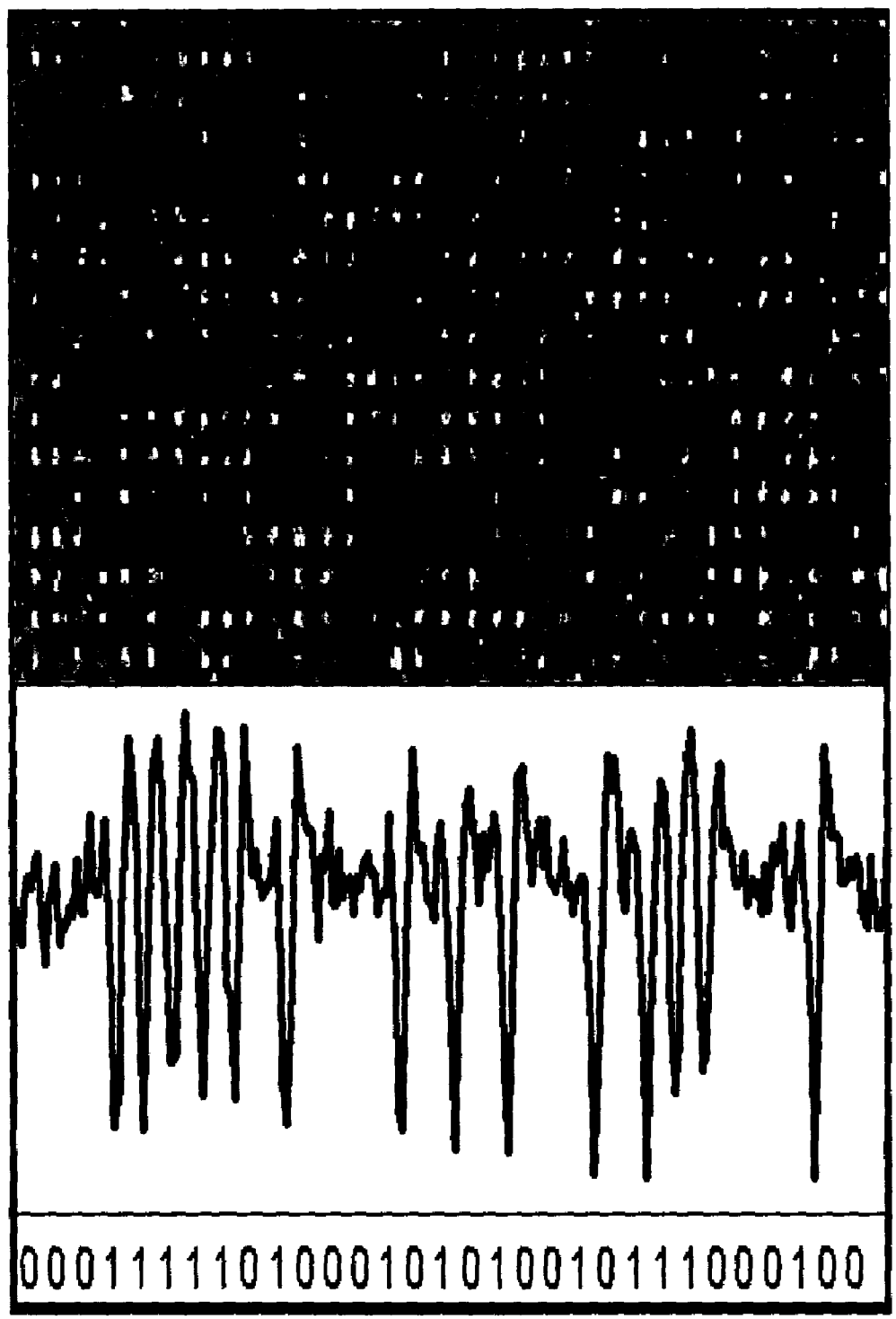

FIG. 5 is an AFM image and an AFM scan-line cross section showing bits written in a benzocyclobutene (BCB) cross linked polystyrene thin film.

Figure 6:
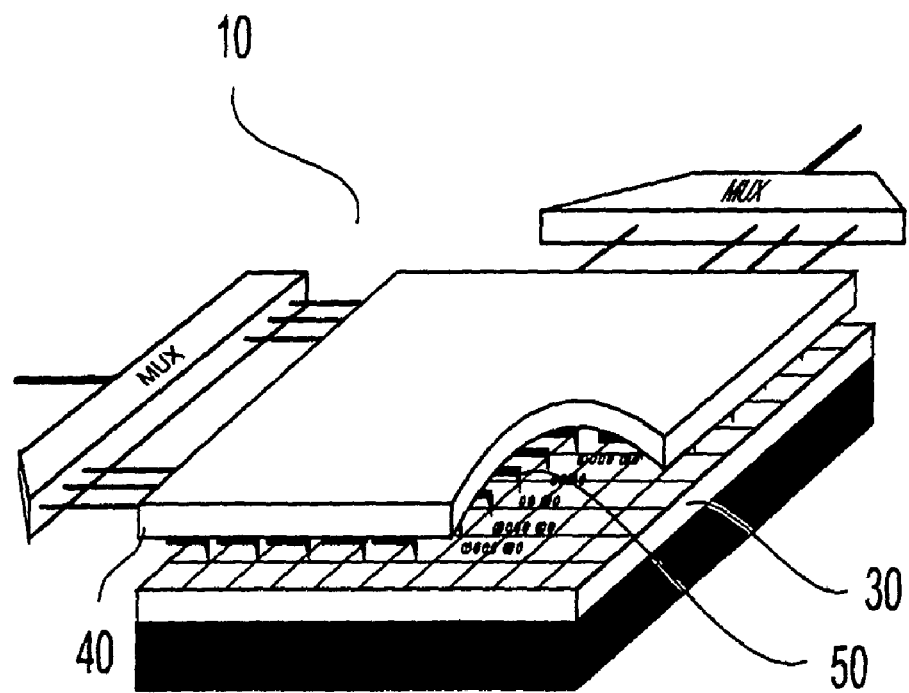

FIG. 6 is an isometric view of a local probe storage array.

Figure 7:
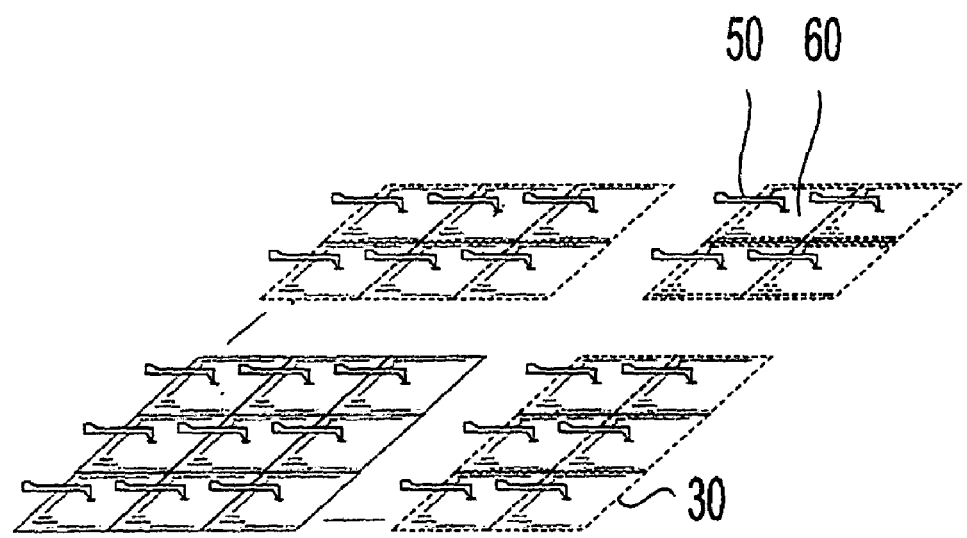

FIG. 7 is an isometric view of a storage surface of the local probe storage array.

Figure 8:
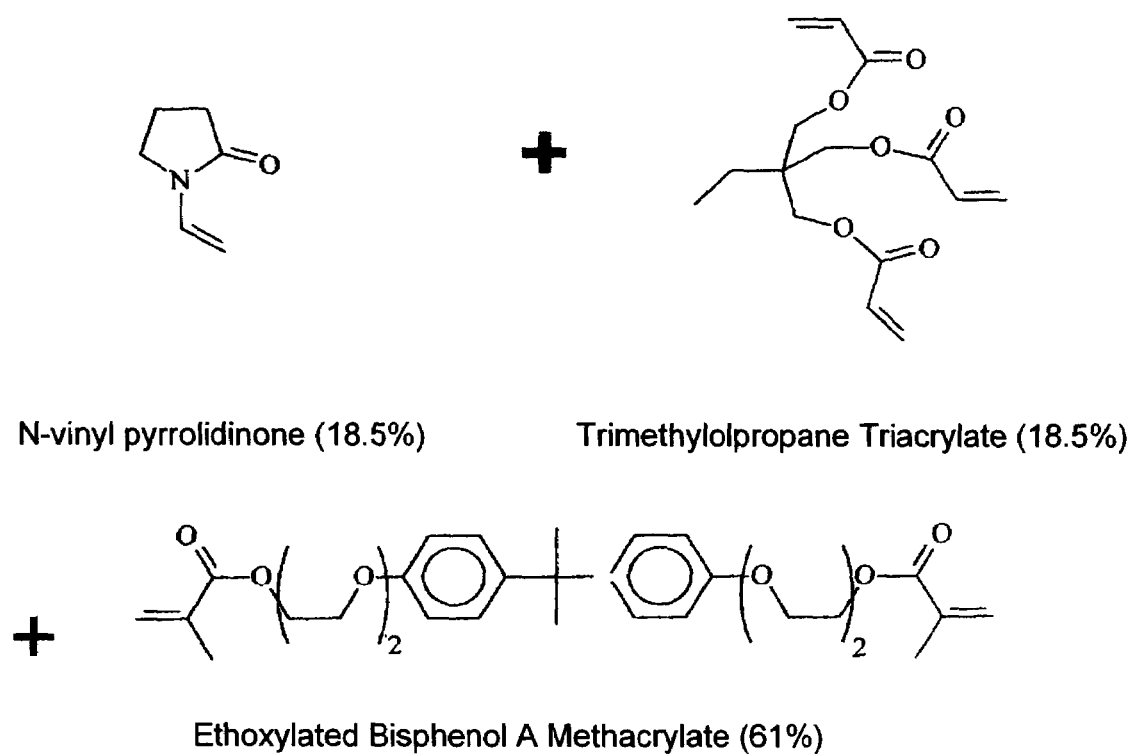

FIG. 8 illustrates a typical formulation of N-vinyl pyrrolidone, trimethylolpropane triacrylate, and ethoxylated bisphenol A dimethacrylate suitable as an example of a photocurable crosslinkable thin film.

DETAILED DESCRIPTION OF THE INVENTION

The read-write mechanism in the atomic force microscope device relies on thermomechanical deformation of a thin polymer film. Some control over heat transfer and load transfer can be engineered into the design of the device's cantilever arrays. However, control is also conferred by molecular level design of the information storing polymer layer. We have found that careful choice of the synthetic monomeric components yields a polymeric material with modulus, wear resistance, and thermal conductivity optimized for device energy efficiency, storage density, and long-term stability. Moreover, molecular level design of the invention described herein includes molecular level custom design of polymers that will allow fine-tuning the thermal and mechanical response of the polymeric medium. Molecular level design of the information storage material includes introducing chemical functionalities that allow for controlled cross linking of the polymer, thereby providing both the stability of macromolecules and the flexibility of linear materials.

Figure 1:
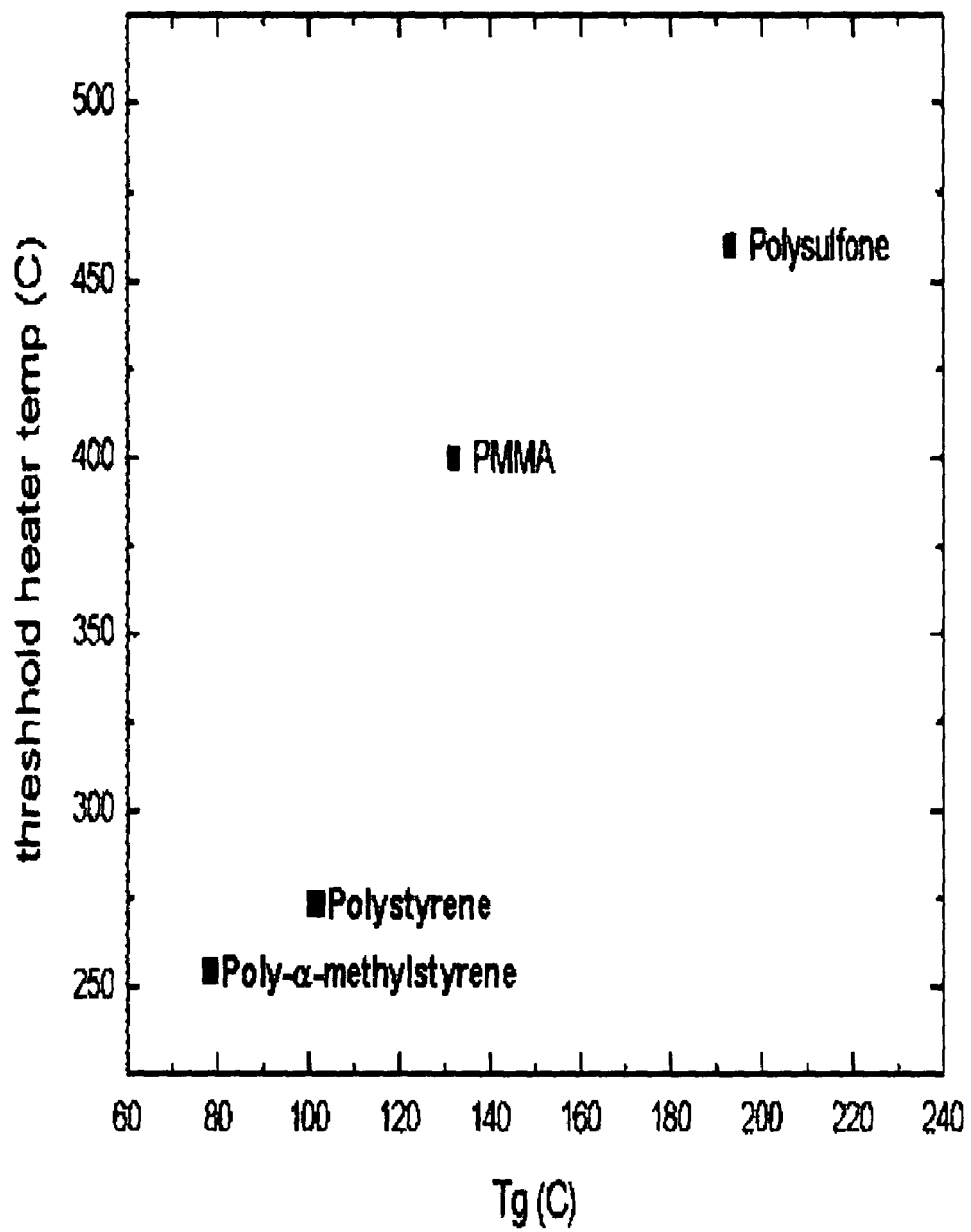
FIG. 1 is a plot of input energy and glass transition temperature ($T_g$) for various commercially available polymers.

In addressing device energy efficiency, sufficient heat must be provided by the tip to the polymer thin film to raise the temperature of the polymer to a point where the polymer softens and the tip sinks in, creating or erasing an indentation (bit). The temperature at which the polymer softens—the glass transition temperature ($T_g$)—is critically dependent on the molecular structure of the polymer, including degree of polymerization and degree of cross-linking. In a series of thermal threshold measurements on a range of commercially available polymers performed by Vettiger et al., the correlation between input energy and $T_g$ has been demonstrated and is illustrated in FIG. 1.

In additional threshold experiments the parameter of polymer molecular weight was adjusted, similarly demonstrating control over the thermal window for writing bits. The correlation between polymer molecular weight and $T_g$ is well-established.

We have now found that control over writing threshold, $T_g$, of polymers, can be designed into the polymer system through the choice of cross linking agents and the polymerization conditions to yield cross linked copolymers.

The nature of the cross linking agent provides this degree of control. The cross linking agent must be activatible and react at a fast enough rate to lead to efficient cross linking. It is also critically important that the reaction leads to a stable structure, which is unreactive under the writing/reading conditions.

The preferred cross linked polymers include the polymeric reaction products of, strictly by way of exemplification and not limitation, benzocyclobutene, dicyclopentadiene, 5-ethylidene-2-norbornene, 5-methylidene-2-norbornene, 1,4-hexadiene, butadiene, isoprene, cyclopentene, ethylene glycol dimethacrylate, and divinylbenzene, as well as polyacetylenic moieties and biphenylene derivatives, functionalities, and moieties, as well as other functionalities, intermediates, and moieties that can be transformed into crosslinking agents, including into interpenetrating networks. The cross linking agent need only be present at an effective level to enable or facilitate cross linking, and lead to appropriate wear properties and thermal characteristics.

Especially preferred are polymers with benzocyclobutene moieties as cross linking agents and cross linked polymers containing moieties of benzocyclobutenes, as 3-vinylbenzocyclobutene with vinyl monomers such as styrene or butyl acrylate.

The synthesis of the desired monomer, 3-vinylbenzocyclobutene, (hereinafter "1"), is outlined in scheme 1 and involves reaction of the 3-bromobenzocyclobutene, (hereinafter "2"), with n-butyl lithium followed by treatment of the lithium salt with N, N-dimethylformamide to give the aldehyde, (hereinafter "3"). Wittig coupling of the aldehyde 3 with $(Ph)_3P=CH_2$ (hereinafter "4") then gives the desired vinyl derivative, 3-vinylbenzocyclobutene, 1, in high yields.

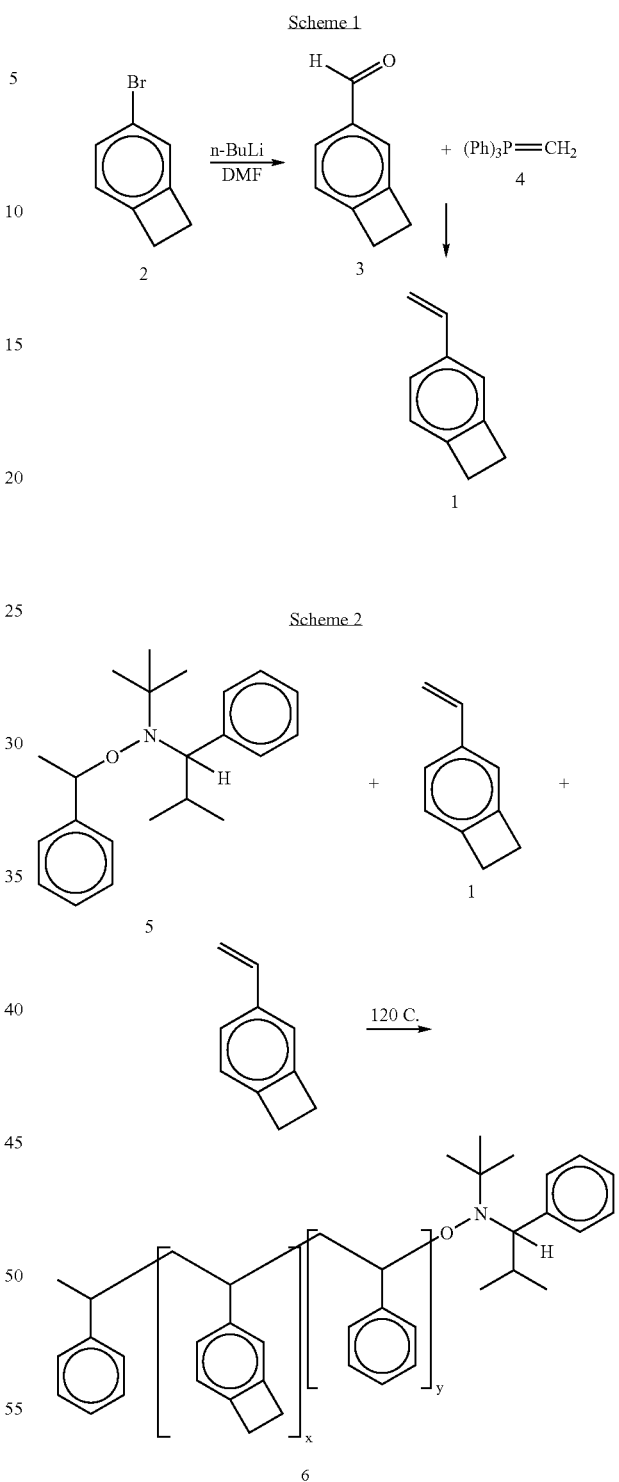

Figure 2:
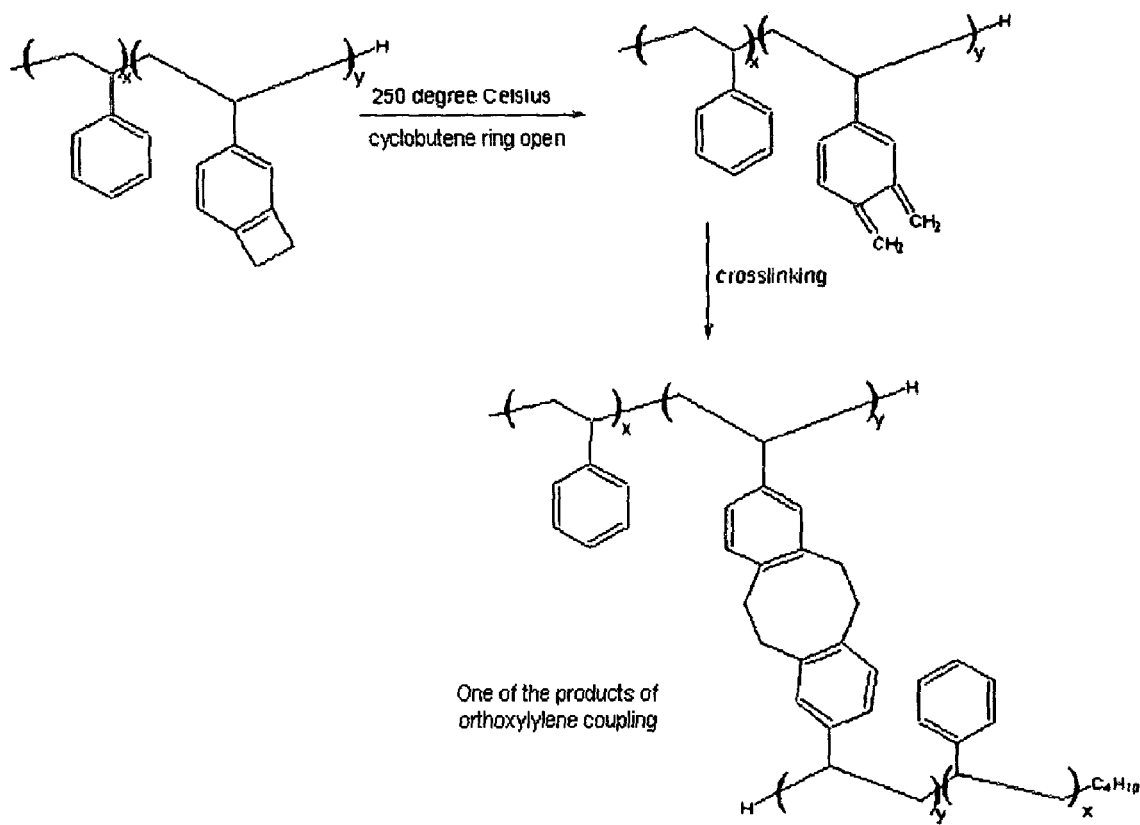
FIG. 2 illustrates a reaction pathway for the thermally activated cross linking of benzocyclobutene substituted polymers.
Figure 3:
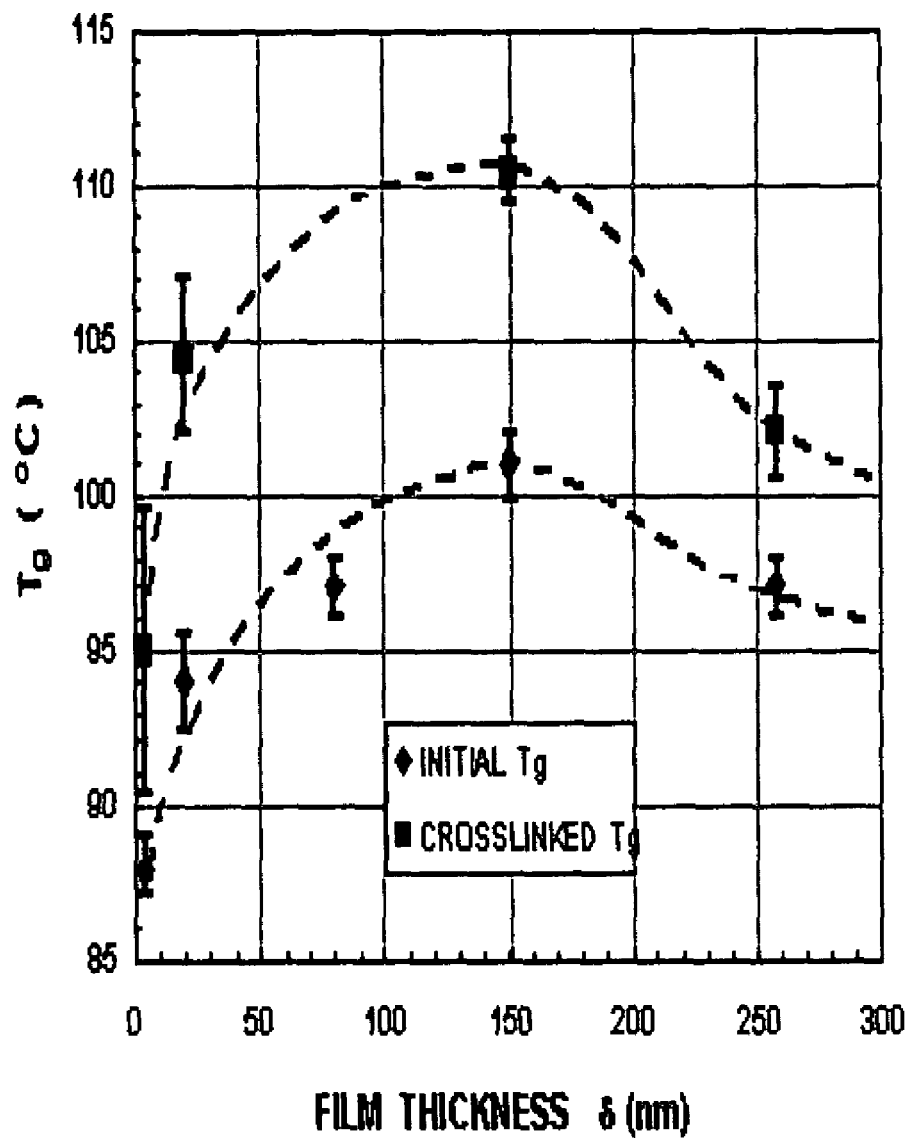
FIG. 3 is a plot of measurements showing that the incorporation of cross linking agent shifts the $T_g$ to higher temperatures.

Copolymerization of 3-vinylbenzocyclobutene, 1, with vinyl monomers such as styrene or butyl acrylate in the presence of an appropriate initiator, such as γ-hydrido alkoxyamine, (hereinafter "5") yields a random incorporation of the reactive benzocyclobutene (hereinafter "BCB") units in the resulting copolymer 6 (Scheme 2) of defined molecular weights and low polydispersities (1.08-1.12). The cross links are provided by an intermediate that is generated in-situ from, for example, the benzocyclobutene (BCB) group, on application of heat. The reactive intermediate (in this case ortho xylylene) then couples with species on adjacent polymer chains, resulting in a cross linked matrix, one structural example of which is shown in FIG. 2. The degree of cross linking is controlled by the percentage of benzocyclobutene incorporated in the original copolymer.

While the cross linking action of BCB is known commercially in adhesion promotion, its incorporation into linear hydrocarbon polymers has been more recent, with initial results on incorporating BCB into polystyrene produced under anionic or living free radical conditions. The polymeric medium is prepared as a thin film in its more easily processed form. The medium is then heated to induce cross-linking. Measurements have shown that the size of the shift in $T_g$ to higher temperatures depends on the percentage of cross-linking agent incorporated in the synthesis of the polymer as illustrated in FIG. 4.

By tailoring the $T_g$ of the medium in this manner, the amount of energy required to thermally write or erase bits is closely controlled at the device's polymeric storage medium preparation stage. Also surprisingly gained in the introduction of cross-linking is an increase in long-term stability. Experimental evidence demonstrates that reliable write-erase cycles can be performed on highly cross-linked polymers as illustrated in FIG. 4. This is surprising since intuition would suggest that the cross-linked thin films would be intractable. For example, they might be expected to gradually decompose during repeated write-erase cycles. In fact, we have found that the erasing process is significantly improved for the cross-linked materials when compared to their linear analogs such as PMMA. Furthermore, highly cross-linked materials show a greater increase in wear resistance (with respect to normal linear polymers like PMMA) than expected from macroscopic wear tests. Another advantage of cross linked materials is that the temperature where softening occurs can be controlled during the polymerization process via the degree of cross-linking, the nature and choice of the cross-linking agent and the thermal behavior of the polymeric backbone, as well the choice of monomers in the polymer synthesis.

Cross linkable thin films that are easily processed can also be formed by spin coating monomer mixtures that contain an initiator, for example, a photoinitiator that is susbsequently treated with radiation, typically with UV-radiation. A typical formulation is shown in FIG. 8 of 18.5 percent N-vinyl pyrrolidone, 18.5 percent trimethylolpropane triacrylate, and 61 percent ethoxylated bisphenol A dimethylacrylate and 2 percent initiator, not shown. A number of commercially available materials, such as SU-8, are also available. Again varying the concentration and structure of the cross linking monomer can control the ultimate extent of cross linking reaction. In addition the $T_g$ and rheological behavior of the thin films can be controlled by selection of the appropriate monomers.

A number of linear polymer materials were tested for wear during reading (different types of PMMA, polystyrene, α-Me-polystyrene, poly(fluorinated alkenes), polysulfone, polyimide). As can be seen in FIG. 4, although they vary a lot in wear behavior, the wear rate is so high that their use in storage applications is not practical. To reduce the wear rate we introduced cross linking groups. The data are shown for a series of BCB-cross-linked PS and PMMA and also for a photocrosslinked thin film derived from SU-8. Significantly, the data show that by choosing the right cross-link density one can achieve excellent wear rates (less then $10^{-3}$ nanometers/scan).

It was also surprising to note that the erasing scheme described in earlier literature works much better on cross-linked materials. For example, PMMA degrades after only a few hundred read-erase cycles, while over 100 000 write-erase-cycles have been achieved on cross linked materials of our invention. The observation of the enhanced writing efficiency, wear improvement and erasing performance is not at all obvious. It can be argued that the cross-link density in materials like the photopolymerized thin films and thermally cross-linked BCB-functionalized PMMA/PS materials is so high, that making indents of the given size (10-50 nanometers diameter and depth) cannot be done without breaking some chemical bonds, and that this should lead to a rapid degradation of the material. However, this is not the case.

At the same time cross-linking leads to an increase of softening temperature. This could be exploited to tune the softening temperature (and by this the writing temperature) to be in an optimum region (see Table 1) by choosing the right polymer backbone. The writing/softening temperature plays a role in the power budget of a storage device, and also has an influence on the lifetime of written indents. Table 1: Experimental writing temperatures on various materials (in units of ° C.) versus cross-linker concentration.

| polystyrene with BCB cross-linker | | PMMA with BCB cross-linker | |
|---|---|---|---|
| (BCB molar %) | Writing temp. | (BCB molar %) | Writing temp. |
| 0% | 275 | 0% | 400 |
| 1.3% | 290 | 5% | 430 |
| 4.7% | 305 | 17% | 620 |
| 5.4% | 310 | | |
| 10% | 340 | | |
| 20% | 435 | | |
| 30% | 465 | | |

As used in the above table "Writing Temperature" means the temperature to which the device's writing tip has be to raised in order to result in a detectible indent.

As a result of the improvements that occur with the use of cross linked polymeric thin films as the recording medium, recording of digital information can now be accomplished in a significantly enhanced manner as demonstrated in FIG. 5. As discussed above, the following advantages have been established:
  increased device energy efficiency via fine tuning of polymer thermal properties
  decreased media wear due to stabilization of the storage layer.

FIG. 5 is illustrative of bits written in a benzocyclobutene (BCB) cross linked polystyrene thin film.

FIGS. 6 and 7 illustrate the general configuration of the thermal-mechanical probe and data storage media of the invention. As shown in FIGS. 6 and 7, an atomic force microscopy thermal mechanical probe is brought in proximity to a layer of the cross linked polymeric material of the invention. This induces a deformed region by creating or erasing indentations in the layer of cross-linked polymeric material Specifically, referring to FIG. 6, the memory 10 of the data processing system comprises a local probe storage array. The local probe storage array comprises a storage surface 30 having the locally deformable, cross-linked, polymeric film of the invention disposed thereon and an array of micro mechanical probe sensors 40 each having a probe tip 50 of nanometer-scale dimensions facing the cross-linked, polymeric coating. In operation, during a data write operation, the tips 50 are brought into proximity to the storage surface 30. Energy is selectively applied to each tip 50, typically in the form of heating. The energy applied to the tips 50 is transferred to the cross-linked polymeric storage surface 30. The energy transfer produces a local deformation in the cross-linked polymeric storage surface 30 in the vicinity of each energized tip 50. The array 40 of tips 50 is moved relative to the storage surface 30 between successive write operations in preparation for writing to new locations on the storage surface 30.

During a read operation, the array 40 of tips 50 are brought into proximity to the storage surface 30. Simultaneously, the tips 50 are scanned relative to the storage surface 30. Local deformations of the cross-linked polymeric storage surface 30 (produced during the write operation) produce deflections in the tips 50 as they are scanned over the surface 30. The presence or absence of a local deformation in the storage surface 30 by a tip 50 can be detected as a stored "1" or stored "0" (or vice versa).

With reference to FIG. 7, it will be appreciated that each tip 50 of the array 40 scans a separate field 60 of the storage surface 30.

In a particularly preferred embodiment of our invention the method of data reading, writing, and erasing is carried out by bringing a thermal-mechanical probe, that is, a nanometer scale atomic force microscopy thermal mechanical probe, into contact with a layer of the cross linked polymeric material of the invention to induce a deformed region by creating or erasing indentations in a layer of cross-linked polymeric material.

Preferably, the cross linking agent is a benzocyclobutene, and the monofunctional monomer is a vinyl monomer or a multifunctional epoxide.

The degree of cross-linking in the material is between 5 and 100%, and preferably between 30 and 60%, and the glass transition temperature of the material is between 150 and 600 K, and preferably between 300 and 450 K. This yields a RMS (root mean square) surface roughness of the material that is less than 10 m and preferably less then 1 nm prior to writing contact.

The following examples are illustrative of the materials of the invention as well as of the methods for synthesis and device preparation.

EXAMPLES

Experimental

Instrumentation. Gel Permeation Chromatography (GPC) was performed on a Waters chromatograph (four Waters Styragel HR columns HR1, HR2, HR4, and HR5E in series) connected to a Waters 410 differential refractometer with THF as the eluant. Molecular weight standards were narrow polydispersity polystyrene standards. Ellipsometry was carried out on a Rudolph Auto-EI ellipsometer. Contact angle measurements were recorded on a VCA 2500 video contact angle system with a drop size of 1.00 µl. Electron micrographs were recorded on a Hitachi S-4700 Scanning Electron Microscope (SEM). AFM micrographs were recorded in tapping mode on a Nanoscope III from Digital Instruments. FTIR spectra were recorded in transmission mode on a Thermo Nicolet Nexus 670 FTIR spectrometer using double polished wedged silicon wafers.

Materials
3-Carboxaldehydebicyclo[4,2,0]octa-1,3,5-triene or
4-carboxaldehydebenzocyclobutene To a 500 ml flask was added 50 ml dry of THF, Mg turnings (2.88 g, 120 mmol) and 1,2-dibromoethane (4 drops). The reaction mixture was then heated under reflux for 15 min, 4-Bromobenzocyclobutene (20.0 g, 109 mmol) in 25 ml THF was added via a dropping funnel to form the Grignard reagent. After addition and rinsing the dropping funnel with 25 ml of dry THF, the reaction mixture was heated for an additional 45 min under reflux to give a green brown solution. The reaction mixture was then cooled down to 0° C., DMF (15 ml, 210 mmol) was added dropwise to the solution and the reaction mixture was heated under reflux for 15 min. The reaction mixture was poured onto 150 g of ice, acidified to pH=4 and neutralized with sat. $NaHCO_3$ solution. The crude product was extracted with ethyl acetate, the organic phase was filtered over celite and evaporation of the solvent gave the crude product. The product was purified by column chromatography using 10% diethylether/hexane as eluting solvents and was finally purified by Kugelrohr distillation (145° C., 0.5 mm) to give the aldehyde, 6, (11.7 g, 81.2%) as a colorless liquid;

IR 3000-2800, 1690, 1598, 1216, 1067 and 827 $cm^{-1}$; $^1$H-NMR (400 MHz, $CDCl_3$)γ: 9.9 (s, 1H, CHO), 7.65 (dd, 1H, J=7.4 Hz, J'=1.2 Hz, ArH), 7.50 (s, 1H, ArH), 7.14 (dd, 1H, J=7.4 Hz, J'=1.2 Hz, ArH), 3.15 (s, 4H, $CH_2$); $^{13}$C-NMR (100 MHz, $CDCl_3$) γ: 192.28, 153.69, 146.57, 135.4, 130.26, 122.89, 122.81, 29.97, and 29.23; Anal. Calcd for $C_9H_8O$; C, 81.8; H, 6.10. Found: C, 81.7; H, 5.94.

3-Ethenylbicyclo[4,2,0]octa-1,3,5-triene or
4-vinylbenzocyclobutene

To a 500 ml round bottom neck flask was added (Ph)$_3PCH_3Br$ (24.3 g, 68.1 mmol), 110 ml of dry THF and the solution cooled to −78° C. n-BuLi (2.5 M in hexane) (26.4 ml, 66 mmol) was added dropwise and the reaction mixture was allowed to warm to RT. The yellow-orange solution was cooled to −78° C. and the aldehyde (7.16 g, 54.2 mmol), diluted in 34 ml of dry THF, added slowly, warmed to room temperature and stirring continued for 2 hrs. The reaction was treated sequentially with sat. $NH_4Cl$ and sat. $NaHCO_3$ solution and the crude product was filtered over celite, washed with diethyl ether/hexane (1:1) and evaporated to dryness (no heat) to give the crude product. Further purification by column chromatography using 5% diethyl ether/hexane as an eluting solvent followed by Kugelrohr distillation (75° C., 1.0 mm) gave the pure styrene derivative, 4, as a colorless liquid (5.50 g, 78%); IR 2925, 1627, 1473, 989, 901, and 829 $cm^{-1}$; $^1$H-NMR (400 MHz, $CDCl_3$) γ: 7.26 (d, 1H, J=7.4 Hz, ArH), 7.20 (s, 1H, ArH), 7.04 (d, 1H, J=7.4 Hz, ArH), 6.74 (dd, 1H, J=17.5 Hz, J'=10.8 Hz, CH ), 5.70 (d, 1H, J=17.5 Hz, $CH_2$), 5.20 (d, 1H, J=10.8 Hz, $CH_2$). 3.19 (s, 4H, $CH_2$); $^{13}$C-NMR (100 MHz, $CDCl_3$)γ: 146.09, 145.75, 137.94, 136.69, 125.71, 122.58, 119.90, 112.38, 29.52, and 29.35; Anal. Calcd for $C_{10}H_{10}$; C, 92.2; H, 7.80. Found: C, 92.0; H, 8.03.

Random Copolymer of 4 and Styrene, 8

The alkoxyamine initiator, 7 (32.5 mg, 0.1 mmol), dissolved in styrene (10.4 g, 100 mmol) and 4-vinylbenzocyclobutene, 4 (3.25 g, 25.0 mmol), was added to a glass ampoule with a stir bar. After 3 freeze and thaw cycles the ampoule was sealed under argon and heated for 6 hours at 120° C. The resulting polymer was dissolved in dichloromethane and purified by precipitation into a 1:1 mixture of isopropanol/acetone followed by reprecipitation into methanol to give a cross linked polymer with a ratio of styrene moiety to 4-vinylbenzocyclobutene moiety of 4:1, as a colorless powder (12.1 g, 88%), $M_w$=111,000; PDI.=1.11; IR3100-2850, 1601, 1492, 1452, 909, and 699$cm^{-1}$;

$^1$H-NMR (400 MHz, CDCl$_3$)γ: 7.24-6.57 (m, ArH), 3.05 (br s, CH$_2$), 1.83-1.26 (m, CH$_2$, CH); $^{13}$C-NMR (100 MHz, CDCl$_3$)γ: 145.0-146.4, 1127.9, 125.5, 121.8, 42.0-44.0, 40.4 and 29.2.

Random Copolymer of 4 and n-Butylacylate

The alkoxyamine initiator, (32.5 mg, 0.1 mmol) was dissolved in n-butyl acrylate (10.2 g, 72.0 mmol), 4-vinylbenzocyclobutene (1.04 g, 8.0 mmol) and placed in a glass ampoule with a stir bar. After 3 freeze and thaw cycles the ampoule was sealed under argon and heated for 15 hours at 125° C. The resulting polymer was dissolved in dichloromethane and precipitated in MeOH/H$_2$O (3:1) to give cross linked polymer of n-butyl acrylate and 4-vinylbenzocyclobutene, (having an n-butyl acrylate to 4-vinylbenzocyclobutene mole ratio of 9:1) as a colorless gum (10.2 g, 91%), M$_w$=77 500; PDI.=1.12; $^1$H-NMR (400 MHz, CDCl$_3$)γ: 6.83-6.63 (m, ArH), 4.10-3.83 (m, CH$_2$,CH), 3.05 (bs, CH$_2$), 2.22-1.01(m, CH$_2$, CH$_3$).

General Procedure for Formation of Crosslinked Thin Films Based on BCB Chemistry.

The BCB functionalized linear polymer (4.00 g, M$_n$=108 000; PDI.=1.15, 7.5 mol% BCB), was dissolved in anisole (36 g; ca. 10 wt %) and spun-coated onto silicon wafers at 2500 rpm. Changes in the concentration and spin speed can be used to control the thickness of the polymer thin film. The silicon wafers were then heated at 120° C. for 10 minutes to remove solvent and then at 250° C. under argon for 1 hour to crosslink the thin polymer films.

General Procedure for Formation of Crosslinked Thin Films Based on Photochemistry.

Silicon Wafer Preparation. Polished silicon wafers were soaked in a concentrated sulfuric acid solution containing No-Chromix for 5 minutes and rinsed extensively with deionized water. The wafers were then placed in an isopropanol vapor bath for 5 minutes, and dried in an oven. An adhesion promoter, 3-methacryloxypropyl trichlorosilane, was vapor deposited on the silicon wafer under a saturated stream of dry nitrogen.

Photopolymer Solution. The base photopolymer solution (PP1) consisted of the following formulation: Ethoxylated bisphenol-A dimethacrylate (61%), N-vinyl pyrrolidone (18.5%), 2-ethyl-2-(hydroxymethyl)-1,3-propanediol trimethacrylate (18.5%), and 2,2-dimethoxy-2-phenylacetophenone (2%). The monomers and initiator were mixed and stored refrigerated in the dark prior to use. The photopolymer, PP1, was then diluted with propylene glycol methyl ether acetate (PGMEA) to yield a 3 wt % solution. This solution was filtered onto a cleaned and prepared silicon wafer and spun at 3000 rpm for 1 minute, yielding a 30 nm thick film. The wafer was exposed using 365 nm light (14 mW/cm$^2$) for 1 minute and then heated at 125° C. for 1 hour.

Various polyfunctional monomer systems may be used, including, for example dimethacrylates, as well as polyfunctional monomers having one functional group of relatively high reactivity for initial linear polymerization and a second functional group of lower reactivity for subsequent cross linking. Additionally various combinations and/or sequences of polymerization initiators and catalysts may be used to engineer the cross linking sequence and cross linked structure.

Moreover, various fillers such as carbon, silica, clay, talc, or calcium carbonate may be added to modify properties. Moreover, plasticizers and lubricants may be added to modify elastic and deformation properties. Anti-oxidants, such as "free radical sinks" may be added to the cross linked polymers to reduce degradation.

While the polymers, polymerization methods, fabrication methods, and resulting structures have been illustrated and described with respect to certain preferred embodiments and exemplifications, it is not intended to limit the scope of the invention thereby, but solely by the claims appended hereto.

The invention claimed is:

1. A method reading, writing, and erasing data, comprising:
    bringing a thermal-mechanical probe into proximity with a layer of cross-linked polymeric material to induce a deformed region at a point in the film, thereby writing information;
    bringing a thermal-mechanical probe into proximity with the deformed region, thereby reading information; and
    bringing a thermal-mechanical probe into proximity with the deformed region, further deforming it in such a way to eliminate the deformed region, thereby erasing the information; and
    repeating said storing, said reading, and said erasing steps at points in the film.

2. The method of claim 1 wherein the cross linked polymer comprises a benzocyclobutene moiety.

3. The method of claim 1 wherein the cross linked polymer comprises an epoxide moiety as a cross linking agent.

4. The method of claim 2 wherein polymer comprises a vinyl moiety as a monofunctional moietymr.

5. The method of claim 1, wherein the degree of crosslinking in the material is between 5 and 100%.

6. The method of claim 5, wherein the degree of crosslinking in the material is between 30 and 60%.

7. The method of claim 1, wherein the glass transition temperature of the material is between 150 and 600 K.

8. The method of claim 1, wherein the glass transition temperature of the material is between 300 and 450 K.

9. The method of claim 1, wherein the RMS (root mean square) surface roughness of the material is less than 10 nm prior to said contact.

10. A data storage device for an atomic force microscopy data storage system, said system adapted for reading, writing, and erasing data by bringing a nm-scale thermal-mechanical probe into proximity with a layer of cross-linked polymeric material to induce a deformed region at a point in the film, thereby storing information;
    bringing a thermal-mechanical probe into contact with the point to eliminate the deformed region, thereby erasing the information; and
    repeating said storing and said erasing steps at the point in the film.

11. The data storage device of claim 10 wherein the cross linked polymeric material comprises a benzocyclobutene moiety as the cross linking agent.

12. The data storage device of claim 10 wherein the cross linked polymerica material comprises an epoxide moiety as the cross linking agent.

13. The data storage device of claim 12 wherein the monofunctional monomer is a vinyl monomer.

14. The data storage device of claim 10, wherein the degree of cross-linking in the material is between 5 and 100%.

15. The data storage device of claim 14, wherein the degree of cross-linking in the material is between 30 and 60%.

16. The data storage device of claim 10, wherein the glass transition temperature of the material is between 150 and 600 K.

17. The data storage device of claim 10, wherein the glass transition temperature of the material is between 300 and 450 K.

18. The data storage device of claim 10, wherein the RMS (root mean square) surface roughness of the material is less than 1 nm prior to said contact.

* * * * *